(12) United States Patent
Ozmat

(10) Patent No.: US 6,397,450 B1
(45) Date of Patent: Jun. 4, 2002

(54) METHOD OF COOLING AN ELECTRONIC POWER MODULE USING A HIGH PERFORMANCE HEAT EXCHANGER INCORPORATING METAL FOAM THEREIN

(75) Inventor: Burhan Ozmat, Voorheesville, NY (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/570,009

(22) Filed: May 12, 2000

Related U.S. Application Data

(62) Division of application No. 09/098,517, filed on Jun. 17, 1998, now Pat. No. 6,196,307.

(51) Int. Cl.[7] .......................... B23P 11/00; B21D 53/06
(52) U.S. Cl. ............... 29/428; 29/890.035; 29/890.054; 228/173.1
(58) Field of Search .................. 165/80.1, 80.2, 165/80.3, 80.4, 80.5, 133, 185, 907; 29/890.035, 890.054, 428; 228/173.1

(56) References Cited

U.S. PATENT DOCUMENTS

| | | |
|---|---|---|
| 3,049,795 A | 8/1962 | Valyi |
| 4,064,914 A | 12/1977 | Grant |
| 4,381,818 A | 5/1983 | Sachar et al. |
| 4,719,968 A | 1/1988 | Speros |
| 4,753,849 A | 6/1988 | Zohler |
| 4,873,835 A | 10/1989 | Rojey et al. |
| 4,898,234 A | 2/1990 | McGovern et al. |
| 5,126,919 A * | 6/1992 | Yamamoto et al. |
| 5,145,001 A | 9/1992 | Valenzuela |
| 5,150,274 A | 9/1992 | Okada et al. |
| 5,205,353 A | 4/1993 | Willemsen et al. |
| 5,231,968 A * | 8/1993 | Siefkes |
| 5,267,611 A | 12/1993 | Rosenfeld |
| 5,325,265 A | 6/1994 | Turlik et al. |
| 5,535,816 A | 7/1996 | Ishida |
| 6,142,222 A * | 11/2000 | Kang |

* cited by examiner

Primary Examiner—David P. Bryant
(74) Attorney, Agent, or Firm—Duane Morris LLP

(57) ABSTRACT

A heat exchanger and method for cooling power electronics modules. The power electronics module transferring heat generated during operation to the heat exchanger through a thermal base of the power module. The heat exchanger being directly bonded to the thermal base and comprising a metal foam. The metal foam having a network of metal ligaments forming numerous open cells to provide porosity. The metal ligaments are aligned to provide a higher metal density in cross-sectional planes of the foam perpendicular to the intended direction of heat flow.

45 Claims, 4 Drawing Sheets

10 ppi foam laterally compressed in the plane of the page to 15% density.

10 ppi foam laterally compressed in the plane perpendicular to the plane of the paper.

10 ppi foam laterally compressed in a direction perpendicular to the plane of the paper to 40% density.

10 ppi foam laterally compressed in the plane of the paper to 40% density.

(10 ppi, 8% density foam-equaixed cells)

METHOD OF COOLING AN ELECTRONIC POWER MODULE USING A HIGH PERFORMANCE HEAT EXCHANGER INCORPORATING METAL FOAM THEREIN

This is a division of application Ser. No. 09/098,517, filed Jun. 17, 1998, now U.S. Pat. No. 6,196,307.

BACKGROUND OF THE INVENTION

The present invention relates to heat exchangers and, more specifically, relates to a metal foam heat exchanger having a surface for direct bonding to an electronic module.

Performance, reliability and packaging efficiency of advanced power electronics modules strongly depend on their ability to effectively remove dissipated energy. The effectiveness of the heat removal directly translates to lowering the junction temperatures of power semiconductor devices. Lower junction temperatures result in lower reverse saturation current of p-n junctions, higher switching speeds in MOSFET structures, increased reliability of metalized and bonded interfaces and a reduction in operating temperature.

Heat exchangers or heat sinks are metal heat radiators designed to remove heat from electronic components, particularly power transistor modules, by thermal conduction, convection, or radiation. Heat exchangers dissipate heat at a surface of an electronic module which may be generated by an internal junction of a semiconductor device within the module. Heat exchangers may also transfer heat from the location of device being cooled to another location by providing passages for a fluid coolant to flow through the heat exchanger.

In one known technique for cooling electronic modules, an oversized cold plate is attached to the module. The oversized cold plate reduces module temperatures by heat spreading and increasing the surface area for heat dissipation. However, the cold plate adversely increases the weight, volume, and cost of modules. Additionally, bonding the cold plate to the module requires the use of soft polymeric compounds which have high thermal resistance.

Accordingly, it is an object of the present invention to provide a novel heat exchanger and method.

It is another object of the present invention to provide a novel integrated heat exchanger and thermal base plate assembly.

It is yet another object of the present invention to provide a novel metal foam for transferring heat from an electronic module.

It is still another object of the present invention to provide a novel metal foam having a surface for bonding directly to an electronic module where the metal foam provides a heat transfer path for the electronic module.

It is a further object of the present invention to provide a novel heat exchanging foam having a network of metal ligaments for cooling an electronic module by pulling heat away from the module through the metal ligaments and transferring heat in the metal ligaments to another location by directing a fluid coolant through interconnected voids which are formed by ligament surfaces.

It is yet a further object of the present invention to provide a novel heat exchanging metal foam having a network of metal ligaments forming elongated substantially ellipsoidal shaped voids oriented in one direction for directing a fluid coolant through the foam.

It is still a further object of the present invention to provide a novel heat exchanger having plural blocks of metal foam positioned in series on a surface of an electronic module where the blocks have variable thermal performance.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
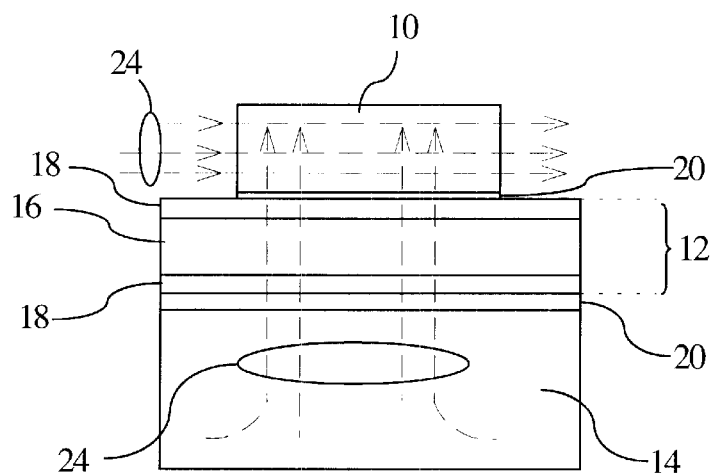
FIG. 1 is a pictorial of one embodiment of a heat exchanger of the present invention.

With reference to FIG. 1, a heat exchanger may include a block of porous metal foam 10. An electronic module to be cooled by the heat exchanger may include thermal base plate 12 and a semiconductor device 14. The thermal base plate,12 may have metalized surfaces 18 for direct bonding with the block 10 and the semiconductor device 14. Direct bonding may be achieved through soldering, active brazing, or simply brazing.

The thermal base plate 12 may be made of any thermally conducting and electrically insulating substrate having a metalizable surfaces and having a coefficient of thermal expansion (CTE) that is substantially matching with the CTE of the silicon power semiconductor device 14 such as AlN, BeO, Metal Matrix Composites, layered or infiltrated all metal composites (e.g., CuMo).

The metal foam 10 may be made of aluminum, copper, or silver. The metal foam heat exchanger 10 may be directly bonded to a low expansion, thermal base plate 12. The CTE of the base plate and metal foam may be substantially different, any physical stresses due to mismatching levels of thermal expansion is minimized by the structural compliance of the foam. Physical stresses due to mismatching level of thermal expansion may be induced by the heat flux generated during the operation of the module or due to the temperature variations in the intended work environment of the module. The effective modulus of the metal foam structures, which scales the thermal mismatch stresses, is known to be proportional to the square of the foam relative density. To provide solderable metalization, a block of aluminum foam may be electroplated with copper and soldered to the thermal base 12 with paste 20.

The $R_{jb}$, junction-to-base thermal resistance of a power module with directly bonded foam based heat exchanger, may be as low as 0.07° C./(Watt*in$^2$). The foam may provide an R$ba$, base-to-ambient thermal resistance, of up to about 0.01° C./Watt for a 1 inch surface contact.

The electronic module to be cooled may be any form of generic high density intelligent and dumb power module which may house a multiplicity of power semiconductor dies (MCT, MOSFET, IGBT, or alike) and diodes as the basic elements of single or multiple switches. The thermal base 12 and the semiconductor device 14 may be considered as being an electronic module or portions of an electronic module which is to be cooled.

In operation, heat 24 generated by the semiconductor device 14 radiates through the thermal base plate 12 into block 10. Heat in block 10 is dissipated through convection by directing a fluid coolant 25 through the block 10 in a direction perpendicular to heat flow 24.

FIGS. 2a–2d are magnified photographs of the metal foam which illustrate the internal structure of the metal foam. As illustrated the metal foam may include a network of ligaments or wires which form numerous open cells. The ligaments are aligned to be in a direction which is substantially parallel to the direction of heat flowing from an electronic module. The aligned metal ligaments provide a higher metal density in cross-sectional planes of the foam perpendicular to the intended direction of heat flow. Due to the higher ligament density, the foam has a lower thermal resistance in the direction in which the ligaments are aligned than in any other direction.

The alignment of the ligaments forces the cells to be aligned in the same direction as the ligaments. The open cells may also be considered pores or voids. The shape of the cells may be substantially ellipsoidal or be considered to be of an equiaxed shape which has been collapsed uniaxially or biaxially. The cells may have opening to permit fluid coolants to pass from cell to cell. The cells are randomly distributed throughout the foam. The cell density of the foam in terms of average number of cells or pores per inch and volumetric density of the foam defines the surface area per unit volume of the metal foam. The porosity of the metal foam is due to gaps in the ligaments which allows a fluid coolant to be passed through the foam in any direction.

The metal foam is fabricated by expanding and solidifying a pool of liquid metal saturated with an inert gas under pressure. The solidification takes place as the saturated gas expands to atmospheric pressure. Density of the porous metal is varied by applying different levels of pressure. The porosity of the foam after solidification may be in the range of 85% to 95% with the open cells generally being equiaxed voids that are randomly distributed throughout the foam.

Figure 3:
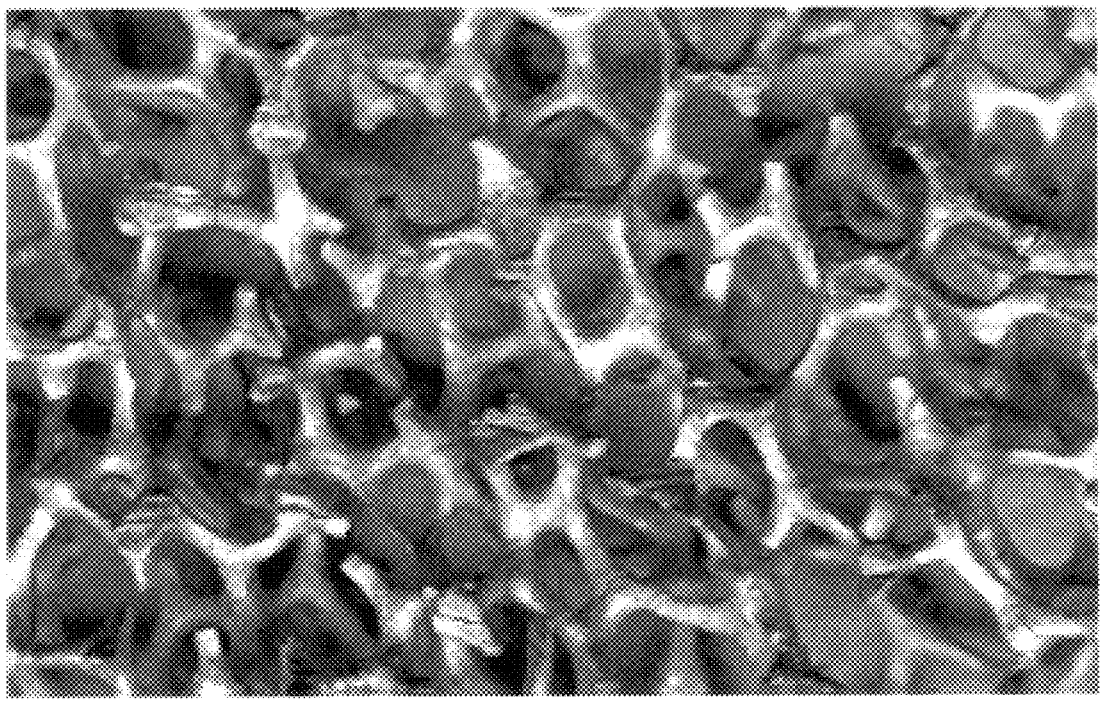
FIG. 3 is a magnified photographic view of a representative cross-section of a block of metal foam having randomly distributed equiaxed cells.

Metal foam having randomly distributed equiaxed pores is commercially available (illustrated in FIG. 3). The commercially available porous aluminum foam provides a pore density of up to 40 pores per inch, a surface area of approximately 10 to 50 $in^2/in^3$ (ligament surface area/metal foam volume) and theoretical mass density of 10% to 20%.

Since the heat flux of the module is one dimensional, the commercially available foam having randomly distributed equiaxed cells is not suitable for electronic module heat transfer applications. To significantly improve the thermal capability of the foam, the randomly distributed ligaments and cells are aligned in the direction parallel to the direction of heat flux to be removed. The alignment is accomplished by compressing and annealing the metallic foam in multiple steps until a desired volumetric density and level of alignment is obtained. The alignment process requires inelastic deformation of the foam through lateral compression. The deformation may be uniaxial or biaxial. After the alignment process, the randomness of the cells (i.e., in size, direction and radius) tends to disappear and the cells have a preferred orientation in a direction perpendicular to the surface of the module. The compression also increases the surface area of ligaments. The volumetric density of the foam may be varied from a before alignment density of 5% to 15% up to theoretically 100% (the pore volume density goes to zero as solid density goes to 100%. The deformation of the foam allows the tailoring of the flow resistance (pressure drop), thermal performance, and structural compliance of the foam.

The aligned foam may provide 150 $in^2$ heat transfer area in a 2 by 1.5 by 0.25 inch sized cavity with a flow resistance of less than 10 psi for up to 2 gpm flow rate for a typical liquid coolants such as water and FC-40. To achieve the same surface area in the same volume with an extruded aluminum based heat exchanger 0.005 inch wide fins with 0.005 inch spacing is required.

In application, the foam may be about 0.05 to 1.00 inches thick. Preferably, the thickness of the block of metal foam is at least about 0.100 inches which may provide a junction to ambient thermal resistance of 0.07° C./Watt for a 1 inch base/foam contact. The foam primarily enhances the surface area and the forced convection coefficients. Further, the three dimensional pseudo-random structure of the foam eliminates macroscopic scale film boiling and provides a high rate of heat transfer through increased number of nucleation sites over the extended surface.

The porosity of the foam must be sufficient to permit continuous flow of fluid coolant. The foam may have a porosity of between about 5 and about 50 pores per inch. The foam may have a volumetric density of between about 20% and 50%. The foam may have a total surface area of between about 2 and about 300 inches squared per cubic inch of foam ($in^2/in^3$)

In packaging, the metallic foam may be a current carrying electrode as well as a heat exchanger. Further, because of the adjustable level of porosity, copper or silver foams can be deposited with CVD diamond to maximize conductivity and cooling capability.

Figure 4:
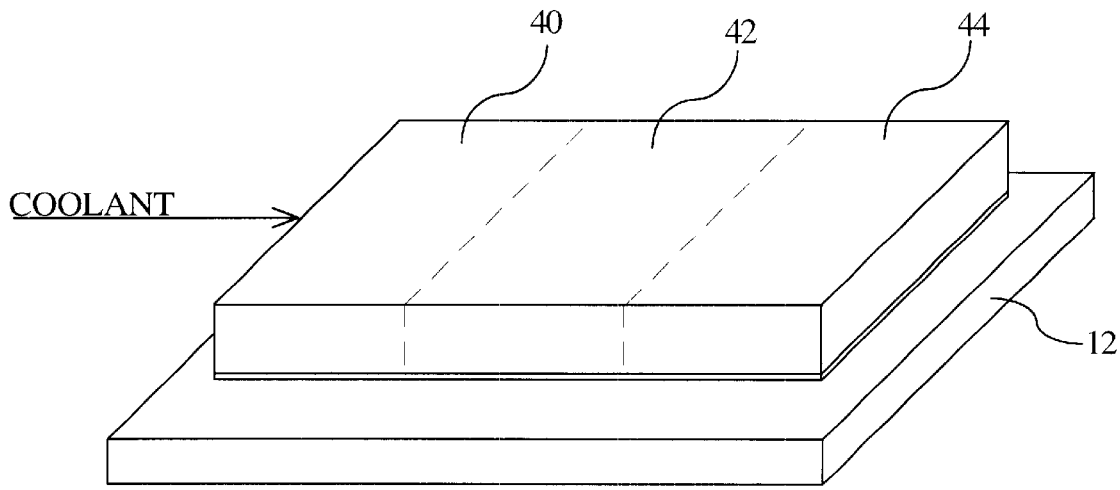
FIG. 4 is a pictorial of a second embodiment of a heat exchanger of the present invention.

With reference to FIG. 4, a heat exchanger may include several blocks of metal foam 40, 42, and 44 positioned in series. The blocks 40, 42, and 44 may be directly bonded to a thermal base 12. The blocks 40, 42, and 44 may have varying densities in order to match varying heat dissipation requirements on the surface of the module. Additionally, smaller blocks may have better structural compliance and are easier to bond.

Figure 5:
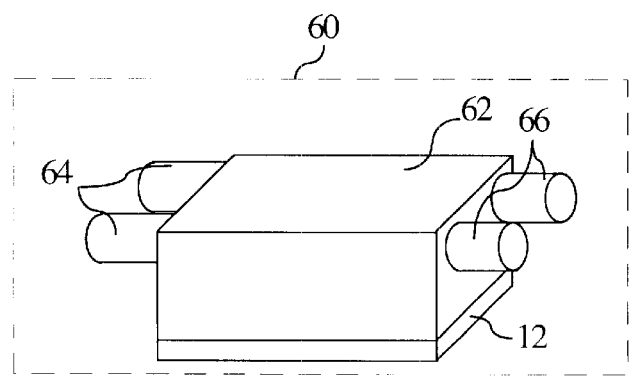
FIG. 5 is a pictorial of one embodiment of an integrated heat exchanger/thermal base plate assembly of the present invention.
Figure 2A:
FIGS. 2a–2d are magnified photographic views of a representative cross-section of a block of metal foam.
Figure 2B:
Figure 2C:
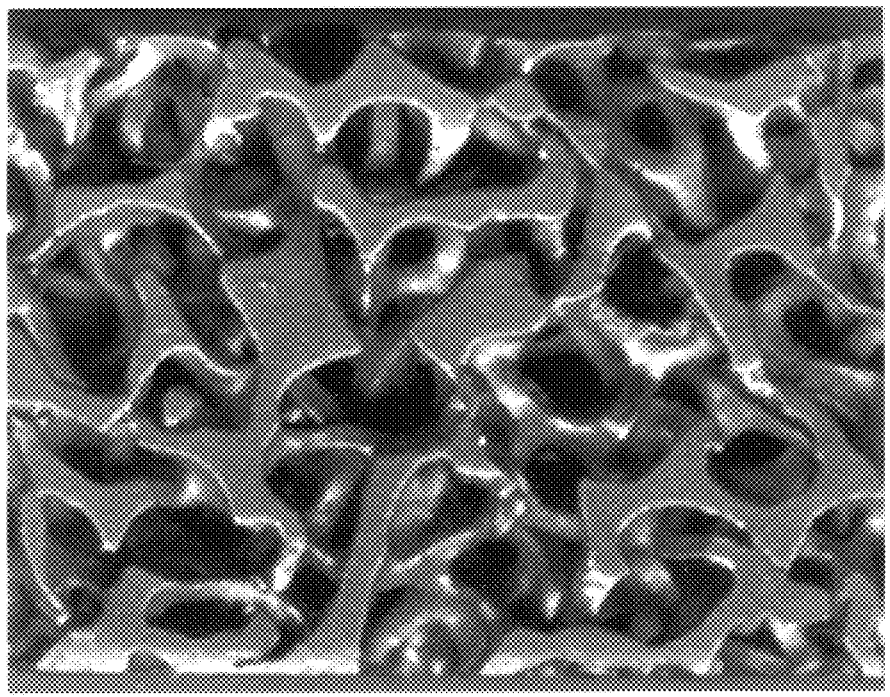
Figure 2D:
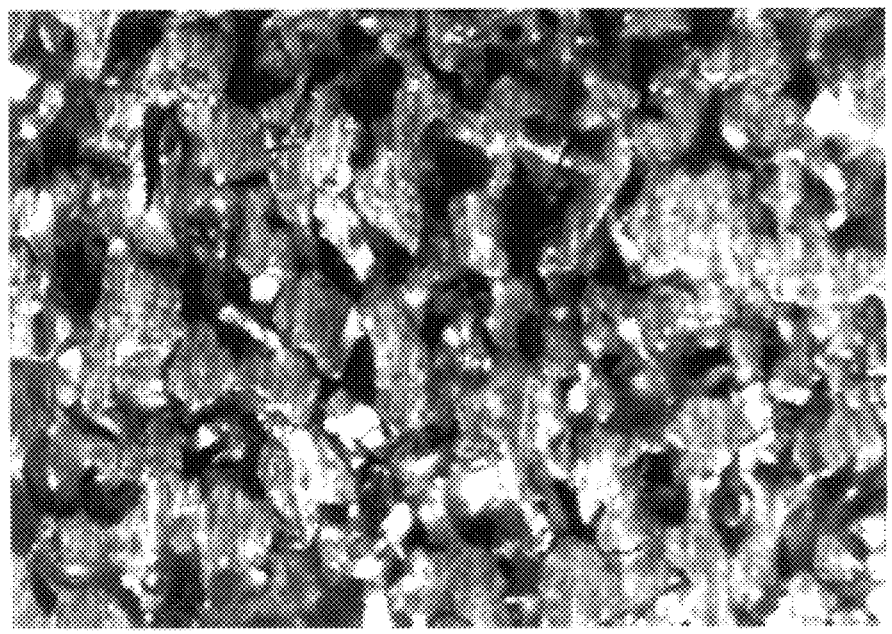

With reference to FIG. 5, an integrated heat sink/thermal base assembly 60 may include a thermal base plate 12, and a casing 62, enclosing a block of metal foam (shown in FIGS. 1–3). The casing may include manifolds 64 and 66.

In operation, convective cooling is accomplished by directing a fluid coolant through the block. The coolant may be directed into the assembly through inlet manifolds 64 and directed out of the assembly through outlet manifolds 66.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:
1. A method of cooling an electronic power module comprising the steps of:
 (a) providing a block of metal foam in a heat transfer relationship to the module to be cooled, the metal foam having a network of ligaments forming randomly distributed open pores, each of the pores having an approximately spherical shape which is elongated in a direction orthogonal to a surface of the module;
 (b) bonding the block to the surface of the module;

(c) directing a fluid coolant through the pores of the foam to remove heat in a substantially perpendicular direction to the surface of the module through the network of ligaments.

2. The method of claim 1 wherein the bonding of the block is direct to the flat surface of the module by a thermally conducting bonding material,
wherein the metal of the block and the material of the module have substantially different coefficients of thermal expansion, and
wherein the structural compliance of the block is such that the physical integrity of the block, the module, and the bond between said block and module is not substantially degraded by temperature variations.

3. The method of claim 1 wherein the bond is thermally conducting.

4. The method of claim 3 wherein the bond is formed by brazing.

5. The method of claim 3 wherein the bond is formed by soldering.

6. The method of claim 1 wherein the foam of the block has a porosity of between about 5 and about 50 pores per inch.

7. The method of claim 1 wherein the foam of the block has a volumetric density of between about 2% and 50%.

8. The method of claim 7 wherein the foam of the block has total surface area of between about 2 and about 300 inches squared per cubic inch of foam.

9. The method of claim 1 further comprising the steps of:
providing a foam having network of ligaments forming pores of equiaxed shape; and
compressing the foam to elongate the pores and increase the density of ligaments perpendicular to the surface of the foam.

10. The method of claim 9 wherein the foam is biaxially compressed.

11. The method of claim 1 wherein the step of providing a block of metal foam is formed by providing plural strips of metal foam positioned in series,
each of the strips having a bonding surface.

12. The method of claim 1 wherein the ligaments are formed from a metal from a group consisting of aluminum, copper, and silver.

13. The method of claim 11 wherein the foam is for providing a junction to ambient thermal resistance of up to about 0.12° C./Watt for a 1 inch surface contact.

14. A method of cooling an electronic power module comprising the steps of:
(a) providing a power module having a flat surface;
(b) providing a block of metal foam in a heat transfer relationship to the module to be cooled, the metal foam having numerous void cells randomly distributed in the foam with the void cells having an orientation perpendicular to the flat surface of the module and having openings for passing a fluid coolant from cell to cell parallel to the flat surface;
(c) bonding the block to the flat surface of the module;
(d) directing a fluid coolant through the void cells of the foam in a generally parallel direction to the flat surface of the module to remove heat.

15. The method of claim 14 wherein the bonding of the block is direct to the flat surface of the electronic module by a thermally conducting bonding material,
wherein the metal of the block and the material of the module have substantially different coefficients of thermal expansion, and
wherein the structural compliance of the block is such that the physical integrity of the block, the module, and the bond between the block and the module is not substantially degraded by temperature variations.

16. The method of claim 14 wherein the metal of the block is one of the group consisting of aluminum, copper, and silver.

17. The method of claim 14 wherein the block is between about 0.050 inches and about 1.000 inch in thickness.

18. The method of claim 14 wherein the foam of the block has a porosity between about 5 and about 100 voids per inch.

19. The method of claim 14 wherein the bond is thermally conducting.

20. The method of claim 19 wherein the bond is formed by brazing.

21. The method of claim 19 wherein the bond is formed by soldering.

22. The method of claim 14 wherein the block is adapted to bond directly to a metallized ceramic surface of the module.

23. The method of claim 14 wherein the block is adapted to bond directly to a metal surface of the module.

24. The method of claim 14 wherein the step of providing a block of metal foam is formed by providing plural strips of metal foam positioned in series,
each of the strips having a bonding surface.

25. The method of claim 14 further comprising the steps of:
providing a foam having void cells of equiaxed shape; and
compressing the foam to elongate the cells and increase the density of the foam perpendicular to the surface of the module.

26. The method of claim 25 wherein the foam is uniaxially compressed.

27. The method of claim 25 wherein the foam is axially compressed.

28. A method of cooling an electronic power module by providing an integrated heat sink/thermal base plate assembly comprising the steps of:
(a) providing a block of metal foam having a bonding surface;
(b) providing a thermal base plate of an electronic module made of a material from the group of a metal, metal matrix compound, and ceramic, where the base plate is coated with metallization for direct bonding with the bonding surface of the block;
(c) bonding the block to the base plate;
(d) providing a casing for housing the block having paths for directing a coolant through the casing parallel to the base plate;
(e) sealing the casing to the base plate;
(f) directing a fluid coolant through the casing in a generally parallel direction to the base plate to remove heat.

29. The method of claim 28 wherein the step of providing a block of metal foam is formed by providing plural strips of metal foam positioned in series,
each of the strips having a bonding surface.

30. The method of claim 28 wherein the casing is primarily formed from a metal.

31. The method of claim 28 wherein the casing is primarily formed from a material which is one of a group consisting of a polymer, a metal, a composite polymer, and a composite metal.

32. The method of claim 28 wherein the casing comprises plural manifolds as paths for directing a coolant through the casing.

33. The method of claim 28 wherein the bond is formed by brazing.

34. The method of claim 28 wherein the bond is formed by soldering.

35. The method of claim 28 wherein the block and base plate are directly bonded through a thermally conducting bonding material.

36. The method of claim 28 wherein the block of metal foam has numerous void cells randomly distributed in the foam with the void cells having an orientation perpendicular to the flat surface of the module and having openings for passing a fluid coolant from cell to cell parallel to the flat surface.

37. The method of claim 36 wherein the block is between about 0.050 inches and about 1.000 inch in thickness.

38. The method of claim 36 wherein the foam of the block has a porosity between about 5 and about 50 voids per inch.

39. The method of claim 28 wherein the foam comprises a network of metal ligaments forming numerous randomly distributed elongated substantially ellipsoidal shaped voids of approximately the same size oriented in a first direction, the ligaments having gaps for passing the fluid coolant through adjacent of the voids, and a higher ligament density in a direction generally perpendicular to the first direction than in a direction generally parallel to the first direction.

40. The method of claim 39 wherein the foam of the block has a porosity between about 5 and about 100 voids per inch.

41. The method of claim 39 wherein the foam of the block has a volumetric density of between 2% and 50%.

42. The method of claim 39 wherein the foam is for providing a junction to ambient thermal resistance of up to about 0.12° C./Watt for a 1 inch surface contact.

43. The method of claim 28 further comprising the steps of:

providing a foam having void cells of equiaxed shape; and compressing the foam to elongate the cells and increase the density of the foam perpendicular to the surface of the module.

44. The method of claim 43 wherein the foam is uniaxially compressed.

45. The method of claim 43 wherein the foam is axially compressed.

* * * * *